US008384385B2

(12) United States Patent
Gross

(10) Patent No.: US 8,384,385 B2
(45) Date of Patent: Feb. 26, 2013

(54) MAGNETIC RESONANCE APPARATUS AND METHOD TO DETECT INCORRECT MAGNETIC RESONANCE DATA

(75) Inventor: Patrick Gross, Langensendelbach (DE)

(73) Assignee: Siemens Aktiengesellschaft, Munich (DE)

( * ) Notice: Subject to any disclaimer, the term of this patent is extended or adjusted under 35 U.S.C. 154(b) by 260 days.

(21) Appl. No.: 12/752,472

(22) Filed: Apr. 1, 2010

(65) Prior Publication Data
US 2010/0253339 A1    Oct. 7, 2010

(30) Foreign Application Priority Data

Apr. 1, 2009   (DE) .......................... 10 2009 015 885

(51) Int. Cl.
*G01V 3/18* (2006.01)
(52) U.S. Cl. ...................................... 324/309
(58) Field of Classification Search ........... 324/300–322
See application file for complete search history.

(56) References Cited

U.S. PATENT DOCUMENTS

| 5,525,906 | A | 6/1996 | Crawford et al. | |
|---|---|---|---|---|
| 5,910,728 | A | * | 6/1999 | Sodickson .................... 324/309 |
| 5,939,884 | A | 8/1999 | Goldfarb et al. | |
| 6,529,000 | B2 | 3/2003 | Lou | |
| 6,841,998 | B1 | 1/2005 | Griswold | |
| 7,219,324 | B1 | 5/2007 | Sherlekar et al. | |
| 2002/0084782 | A1 | 7/2002 | Guthrie | |
| 2005/0111751 | A1 | 5/2005 | Avinash | |

OTHER PUBLICATIONS

Larkman et al., A Feasibility Study of Detection and Correction of Motion Artifacts in MR Imaging of the Larynx Using Parallel Imaging, Proc. Intl. Soc. Mag. Reson. Med. 10, 2002.*
Larkman, Artifact Reduction based on Parallel Data Acquisition, Second International Workshop on Parallel MRI, 2004.*
"Correction of MR k-Space Data Corrupted by Spike Noise," Kao et al., IEEE Trans. On Medical Imaging, vol. 19, No. 7 (2000) pp. 671-680.
"Snore: Spike Noise Removal and Detection," Foo et al., IEEE Trans. On Medical Imaging, vol. 13, No. 1 (1994) pp. 133-136.
"Non-Contrast-Enhanced MR Angiography Using 3D ECG-Synchronized Half-Fourier Fast Spin Echo," Miyazaki et al., Journal of Magnetic Resonance Imaging, vol. 12 (2000) pp. 776-783.
"Peripheral MR Angiography: Separation of Arteries from Veins with Flow-Spoiled Gradient Pulses in Electrocardiography-triggered Three-dimensional Half-Fourier Fast Spin-Echo Imaging," Miyazaki et al., Radiology, vol. 227 (2003) pp. 890-896.
"Improvement in Delineation of Peripheral Arteries Using Non-contrast-enhanced 3D MRA with ECG-Triggered Half-Fourier FSE: Additional Spoiler Pulses in the Phase Encode Direction," Miyazaki et al., Proc. Intl. Soc. Mag. Reson. Med., vol. 11, Abstract No. 1945 (2004).

(Continued)

*Primary Examiner* — Melissa Koval
*Assistant Examiner* — Daniel Miller
(74) *Attorney, Agent, or Firm* — Schiff Hardin LLP

(57) ABSTRACT

In a method and apparatus to detect incorrect MR data in k-space representing MR signals acquired from an examination subject with at least two acquisition coils, MR data are acquired to generate at least one raw data set with each of the at least two acquisition coils and a check is made, for at least one k-space point, as to whether the MR data acquired for this k-space point should be replaced or not. In the event that the check yields that the MR data acquired for the at least one k-space point should be replaced, the MR data are replaced with reconstructed MR data that are based on at least two of the acquired raw data sets.

14 Claims, 4 Drawing Sheets

OTHER PUBLICATIONS

"Flow Compensation in Balanced SSFP Sequences," Bieri et al., Magnetic Resonance In Medicine, vol. 54 (2005) pp. 901-907.

"Gradient Moment Nulling in Fast Spin Echo," Hinks et al., Magnetic Resonance In Medicine, vol. 32 (1994) pp. 698-706.

"Diffusion-Prepared Segmented Steady-State Free Precession: Application to 3D Black-Blood Cardiovascular Magnetic Resonance of the Thoracic Aorta and Carotid Artery Walls," Koktzoglou et al., Journal of Cardiovascular Magnetic Resonance, vol. 9 (2007) pp. 33-42.

"Flow-dependent Arterial and Venous Imaging by Non-Contrast-Enhanced Subtraction Angiography," Priest et al., Proc. Intl. Soc. Mag. Reson. Med., vol. 16, (2008) pp. 727.

"Clinical Evaluation of Aortic Diseases Using Nonenhanced MRA With ECG-Triggered 3D Half-Fourier FSE," Urata et al, Journal of Magnetic Resonance Imaging, vol. 14 (2001) pp. 113-120.

"A Novel Non-contrast MR Angiography Technique Using Triggered Non-Selective Refocused SPACE for Improved Spatial Resolution and Speed," Weale et al., Proc. Intl. Soc. Mag. Reson. Med., vol. 16 (2008) p. 730.

"A General Formulation for Quantitative g-Factor Calculation in GRAPPA Reconstruction," Breuer et al., Proc. Intl. Soc. Mag. Reson. Med., vol. 16 (2008) p. 10.

\* cited by examiner

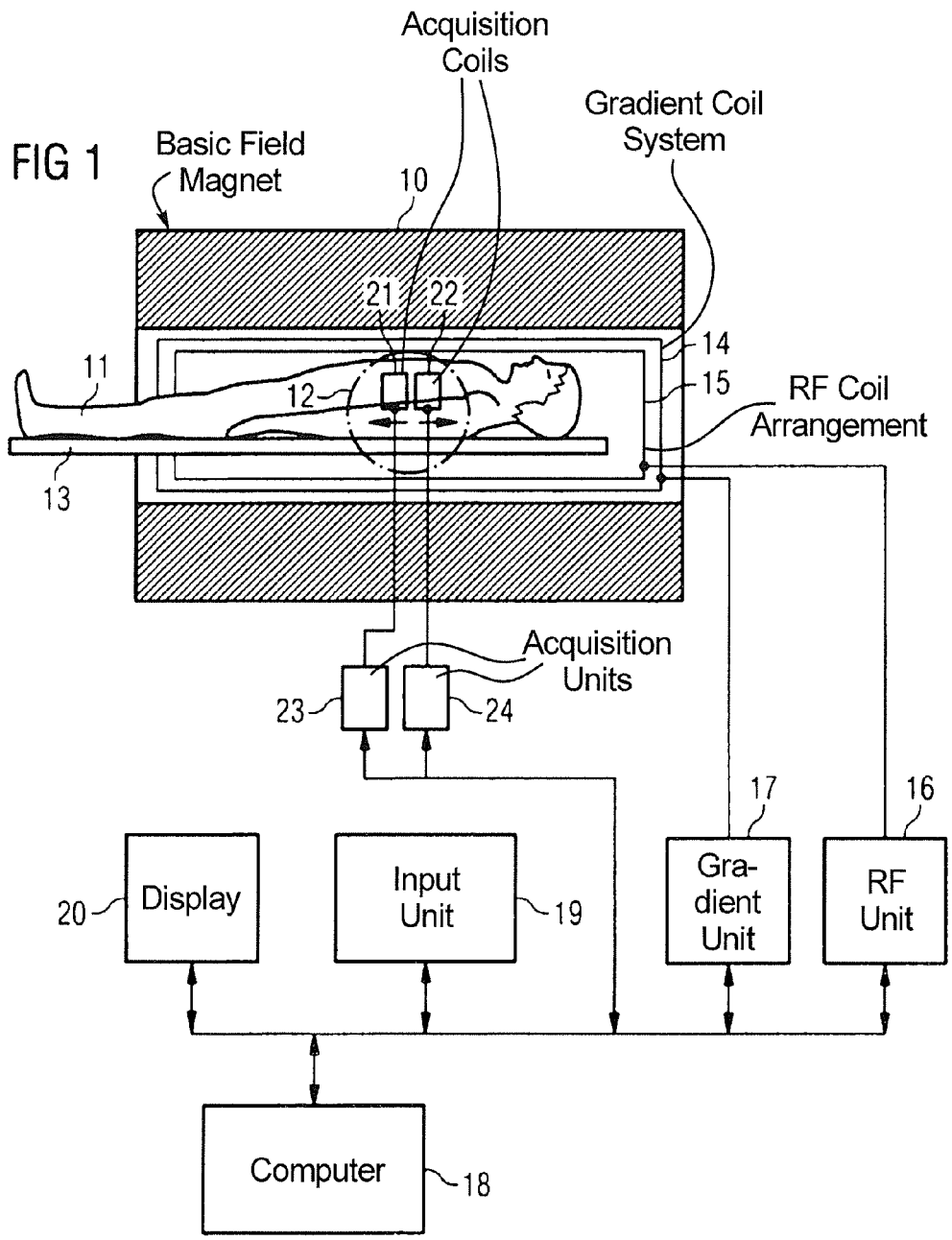

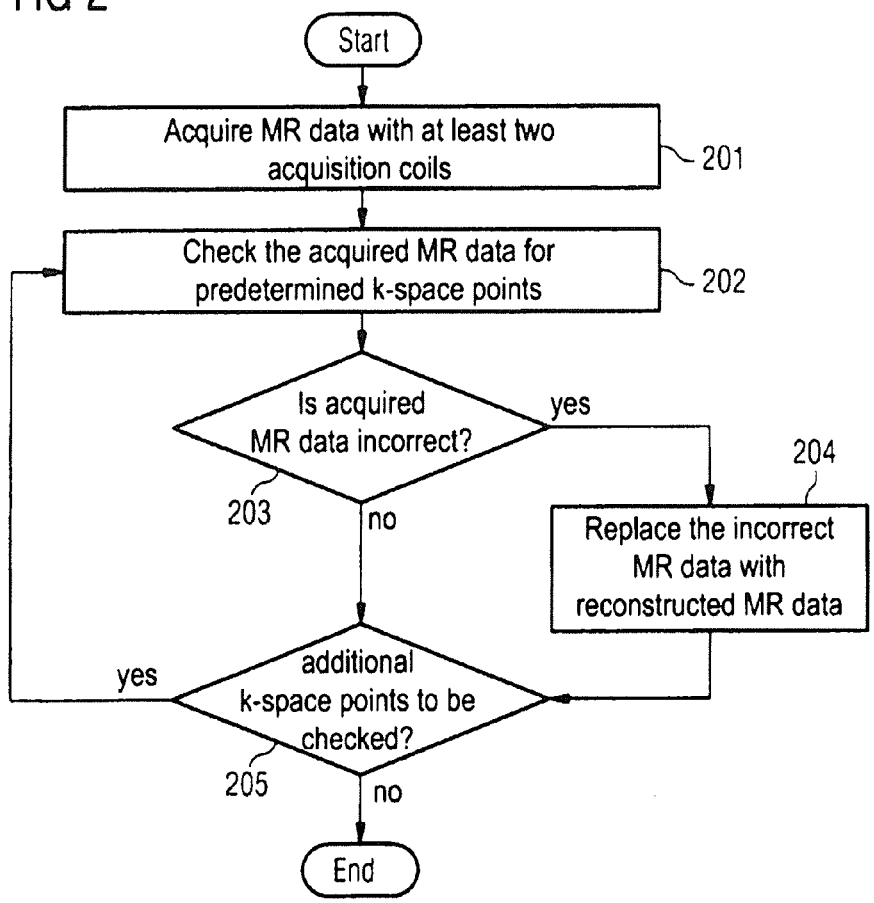

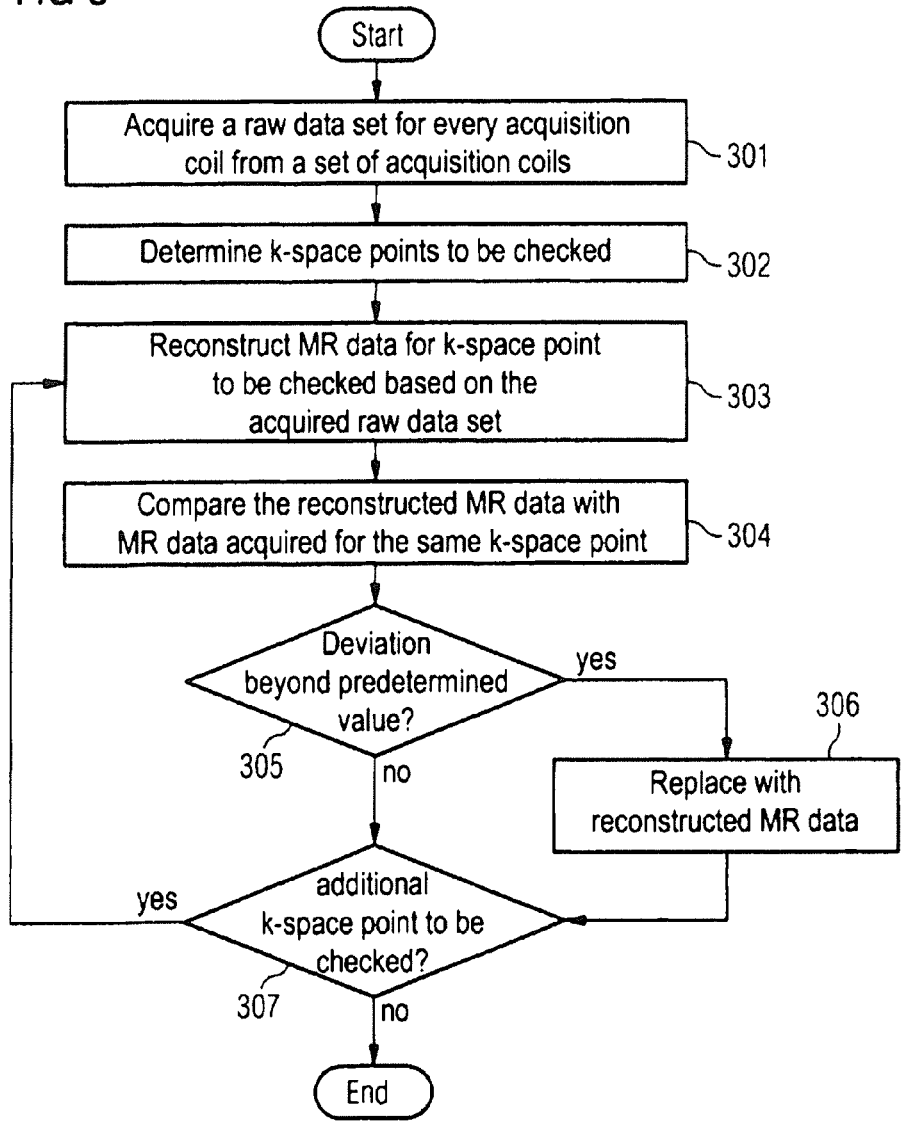

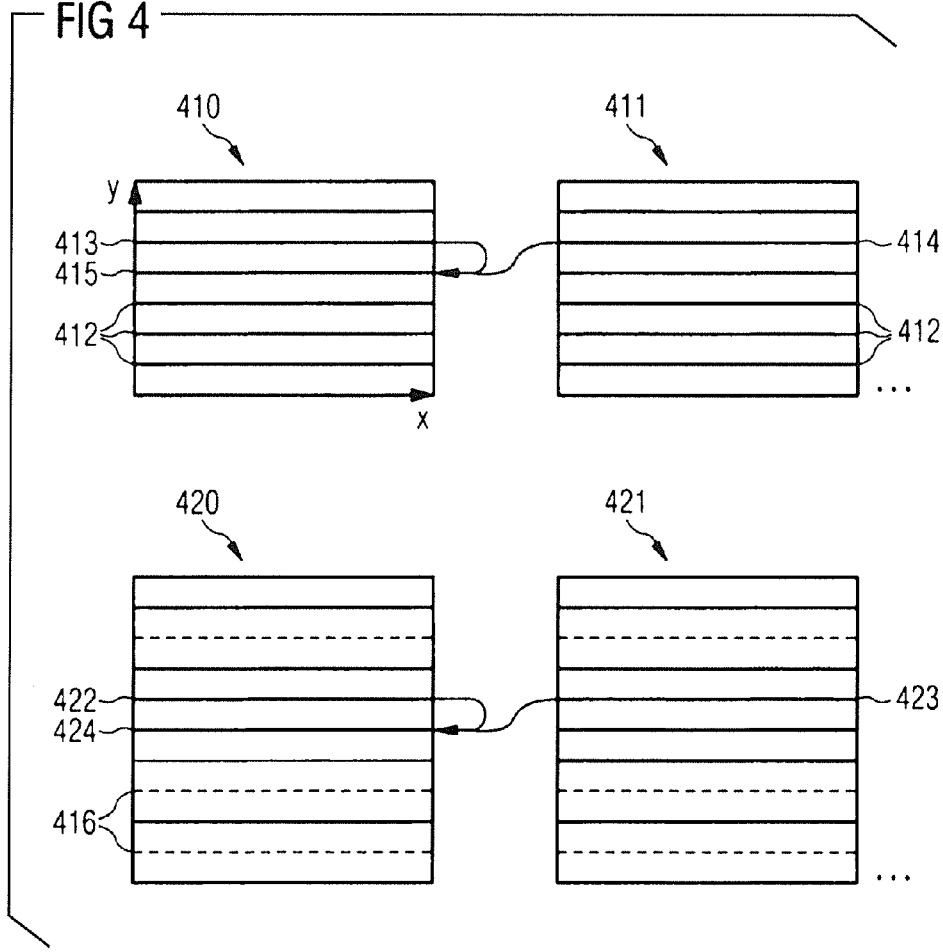

MAGNETIC RESONANCE APPARATUS AND METHOD TO DETECT INCORRECT MAGNETIC RESONANCE DATA

BACKGROUND OF THE INVENTION

1. Field of the Invention

The present invention concerns a method to detect incorrect magnetic resonance (MR) data in k-space representing MR signals acquired from an examination subject. In particular, the invention concerns a suitable replacement of such incorrect MR data.

2. Description of the Prior Art

Magnetic resonance tomography (MRT) is an imaging method that is used in many fields of medicine for examination and diagnosis. MRT is based on the physical effect of nuclear magnetic resonance. To acquire magnetic resonance signals, a static (B0) basic magnetic field is generated in the examination region at which the nuclear spins or, respectively, magnetic moments of the atoms in the examination subject align. The nuclear spin can be deflected from the aligned position via radiation of radio-frequency electromagnetic radiation (RF pulses). The relaxation from this excited position generates a decay signal that can be detected inductively by means of an acquisition coil.

By the application of a slice-selection gradient upon radiation of the RF pulses, nuclear spins are excited only in a slice of the examination subject. An additional spatial coding can ensue during readout by the application of a phase coding gradient and a frequency coding gradient. It is also possible to implement phase coding in two or three spatial directions for 3D imaging, two spatial directions are phase-coded, and frequency coding ensues in the third spatial direction. The coding by means of the magnetic field gradients spans k-space; a frequency-coded MR signal essentially corresponds to a line in k-space. K-space can be filled line by line via switching (activating/deactivating) different phase coding gradients. Image data can be reconstructed from such a digitized raw data set by Fourier transformation. A point in k-space corresponds to a specific spatial frequency in image space based on this relationship.

In the acquisition of magnetic resonance signals by means of the acquisition coils, single or multiple data points in k-space can be affected by errors, for example if they are overlaid with strong noise or interference signals/interference spikes. These errors, known as "spike noise", lead to stripe artifacts in reconstructed images. The quality of reconstructed MR images is thus significantly negatively affected by spike noise.

To circumvent this problem, in some conventional magnetic resonance systems a particular antenna is used that is mounted at a rear part of the magnetic resonance system. If such an interference spike is detected by means of the antenna, the corresponding k-space point is set to zero. Although this simple method enables a certain and automatic discovery of the interference spikes, additional apparatuses for this purpose (for example the antenna, wiring, receiver etc.) are required, and the correction by setting the corresponding value to zero is very imprecise and leads to a reduction of the image quality.

From U.S. Patent Application Publication No. 2002/0084782 A1a method is known with which interference spikes are detected by measurement of the amplitude of signals having frequencies near the frequencies used in the MR experiment (nearband signals). If the signals exceed a specific threshold, the presence of interference spikes is established. This method also requires additional devices. If the same antenna as is used for the MR measurement (data acquisition) is used for the interference spike detection, the signal for interference spike detection must be diverted (tapped) before the further processing of the MR signal.

Such threshold methods are disadvantageous, in particular in the central k-space region where the variation of the MR signals is large. Furthermore, the setting of an incorrect data point to zero or the interpolation of such a data point from adjacent data points leads to false results, and thus to an unsatisfactory reproduction of the incorrect data point. This causes a reduced image quality. Methods that use filtering in image space to remove the resulting artifacts are likewise disadvantageous. These techniques normally make assumptions about the content of the image data that are likewise subject to errors.

It is accordingly desirable to reliably detect interference spikes in acquired magnetic resonance signals without additional devices and to replace them with suitable values. In particular, the replacement should negatively affect the image quality of reconstructed image data as little as possible.

SUMMARY OF THE INVENTION

An object of the present invention is to provide an improved method to detect and replace incorrect MR data.

According to a first aspect of the invention, a method is provided to detect incorrect MR data in k-space given an acquisition of MR signals of an examination subject with at least two acquisition coils. The method includes an acquisition of MR data to generate at least one raw data set with each of the at least two acquisition coils and a check, for at least one k-space point, of whether the MR data acquired for this k-space point should be replaced or not. In the event that the check yields that the MR data acquired for the at least one k-space point should be replaced, the MR data are replaced with reconstructed MR data that are based on at least two of the acquired raw data sets.

For reconstruction, raw data sets are advantageously used that were acquired with different acquisition coils of the at least two acquisition coils. Given the use of at least two of the raw data sets, redundant MR data can exist for a k-space point, such that an incorrect data point can be replaced with a suitable reconstructed data point. The use of reconstructed MR data to replace an incorrect data point has the advantage that such data are not plagued with error to the same degree as interpolated MR data and correspond significantly better to the MR data to be acquired for the k-space position without interference. The quality of reconstructed image data is consequently significantly improved by the replacement with reconstructed MR data. In particular, stripe artifacts can be reduced.

The reconstruction can occur not only in k-space but also in image space or in a hybrid space. A hybrid space is, for example, a space (domain) that uses both spatial and frequency coordinates.

In an embodiment, the checking ensues by comparison of the MR data acquired for the at least one k-space point with a threshold. Interference spikes in the acquired MR data thus can be identified in a simple manner.

An effective determination of incorrect MR data can also be achieved by implementing the check by a comparison of the MR data acquired for the at least one k-space point with a comparison value that takes into account a determined or estimated signal noise in acquired MR data.

In a further embodiment, the checking can ensue through a comparison of the MR data acquired for the at least one k-space point with a comparison value that is determined on the basis of the reconstructed MR data. The reconstruction of the MR data for the k-space point to be checked can thus ensue before the actual check. The reconstructed MR data then can form the basis of the check; the comparison of the acquired MR data with the reconstructed MR data enables a reliable determination of the presence of incorrectly acquired MR data. For example, a threshold for the k-space point can be determined based on the reconstructed MR data, with the expected signal noise being taken into account.

The reconstructed MR data can be reconstructed, for example, with a partially parallel acquisition (PPA) reconstruction method. Such reconstruction methods enable an effective reconstruction in k-space, in hybrid space and in image space. In particular, such reconstruction methods utilize the additional spatial information that is obtained given acquisition of the raw data sets with two differently positioned acquisition coils.

For example, the reconstruction ensues by a combination of MR data from the raw data sets for the different acquisition coils in k-space. For example, MR data that were acquired with a set of acquisition coils are combined using weighting coefficients for the reconstruction. Such coefficients can be determined, for example, on the basis of MR data that are contained in the acquired raw data sets. Such coefficients also can be determined in additional measurements.

The reconstruction can ensue using a GRAPPA (Generalized Autocalibrating Partially Parallel Acquisition) or SMASH (Simultaneous Acquisition of Spatial Harmonics) reconstruction method, for example. Reconstruction methods derived from these, for example G-SMASH, AutoSMASH, VD AutoSMASH etc. are naturally also among the reconstruction methods that can be used. A reconstruction in image space is also possible with these methods.

It is also possible for the reconstruction to ensue using an image space-based reconstruction method, for example the SENSE (Sensitivity Encoding) reconstruction method.

In another embodiment, at least one complete raw data set is acquired with each of the at least two acquisition coils. For example, a complete data set exists when all k-space points are sampled in order to achieve a predetermined resolution of image data to be reconstructed. According to the resolution to be achieved, for example, a predetermined number of phase coding steps that correspond to k-space positions in one k-space direction are predetermined, wherein a sampling of these positions yields a complete data set. Redundant MR data can exist for essentially all predetermined k-space points due to the acquisition of a complete raw data set with each of the at least two acquisition coils, such that incorrect MR data can be replaced with reconstructed MR data for every k-space position.

In another embodiment, the acquisition of the raw data sets with the at least two acquisition coils ensues with a parallel partial acquisition (PPA) method with which at least one reduced raw data set is acquired for each acquisition coil, wherein the reduced raw data sets comprise data for reconstruction of a complete raw data set for k-space to be sampled. For example, specific phase coding steps are omitted in the acquisition of a reduced or, respectively, incomplete raw data set, so a faster acquisition is enabled. By the omission of these coding steps, redundant MR data is not present for all regions of k-space, such that the replacement with reconstructed MR data can be made only in specific regions of k-space. For example, complete MR data are acquired for a central k-space region in a GRAPPA method, so that a replacement of incorrect MR data is possible for this region. Since it is this very region that contains data that are significant for the intensity of pixels in reconstructed image data, a replacement of incorrect MR data there is directly advantageous.

The methods described in the preceding are implemented, for example, automatically by a computer of an MR system.

According to a further aspect of the present invention, a magnetic resonance system is provided for the detection of incorrect MR data in k-space given an acquisition of MR signals of an examination subject. The magnetic resonance system has at least two acquisition coils that are designed to acquire MR signals and a computer that is designed to implement the following steps: acquire MR data to generate at least one raw data set with each of the at least two acquisition coils and check—for at least one k-space point—whether the MR data acquired for this k-space point should be replaced or not; wherein, in the event that the check yields that the MR data acquired for the at least one k-space point should be replaced, the MR data are replaced with reconstructed MR data that are based on at least two of the acquired raw data sets.

Advantages similar to those cited above in connection with the method can be achieved with such a magnetic resonance system.

The present invention also encompasses a non-transitory computer-readable storage medium encoded with programming instructions that, when the storage medium is loaded into a control and processing computer system of a magnetic resonance apparatus, cause the control and processing system to operate the magnetic resonance apparatus to implement the method described above, as well as all embodiments thereof.

BRIEF DESCRIPTION OF THE DRAWINGS

FIG. 1 schematically illustrates a magnetic resonance system according to an embodiment of the present invention.

FIG. 2 is a flowchart of an embodiment of the method according to the invention.

FIG. 3 is a flowchart of a further embodiment of the method according to the invention.

FIG. 4 schematically illustrates the reconstruction of magnetic resonance data according to the invention.

DESCRIPTION OF THE PREFERRED EMBODIMENTS

FIG. 1 schematically shows a magnetic resonance system configured to acquire magnetic resonance data with a set of acquisition coils. Such a magnetic resonance (MR) system has a basic field magnet 10 to generate a polarization field B0. An examination subject (here a person 11 to be examined) can be slid into the magnet 10 on a recumbent table 13, as it is schematically depicted by the arrows. The MR system furthermore has a gradient coil system 14 to generate magnetic field gradients that are used for the imaging and spatial coding. A radio-frequency (RF) coil arrangement 15 that radiates a radio-frequency field into the examined person 11 in order to deflect the magnetization from the equilibrium state (steady state) is provided to excite the polarization resulting in the basic magnetic field. A gradient unit 17 is provided to control the magnetic field gradients, and an RF unit 16 is provided to control the radiated RF pulses.

The acquisition coils or component coils 21 and 22 are provided to acquire magnetic resonance signals from the examination region 12. A larger coil array can also be provided that comprises more than the shown two coils (advantageously 2-200 coils, for example 3, 6, 32 or even 128 coils). Due to the spatially independent arrangement of the coils, additional spatial information is obtained that can be used in order to achieve an additional spatial coding via a combination of the magnetic resonance data acquired simultaneously by the coils. For example, sensitivity profiles of the coils are measured or determined for this. Other methods manage without such profiles. For example, other lines shifted in k-space can thereby be determined from a k-space line at a specific k-space position. The acquisition coils 21 and 22 communicate with separate acquisition units 23 and 24 respectively, so that a raw data set with MR data can be acquired in parallel for each acquisition coil. The coils 21 and 22 can be used not only for detection in other embodiments but also to generate an RF field. Furthermore, a detection of RF fields or, respectively, MR signals can ensue by means of the radio-frequency coil arrangement 15.

The magnetic resonance system is controlled by the computer 18, which serves as a control unit. The computer 18 thus controls the radiation of RF pulses and the acquisition of resulting MR signals, for example. Via an input unit 19 an operator can select a sequence protocol and input and modify imaging parameters that are displayed on a display 20.

The general operation of an MR system is known to those skilled in the art, so that a detailed description of the basic components is not necessary herein.

The computer 18 controls the magnetic resonance system so that a complete raw data set is acquired with each acquisition coil 21 and 22, or so that only a partial or reduced raw data set is acquired with each acquisition coil. The computer 18 can be designed to implement a partial parallel acquisition (PPA) method in which the number of phase coding steps that are used is reduced. Missing k-space lines of such an incomplete data set can subsequently be reconstructed in the computer 18 with known reconstruction methods, for example with GRAPPA or SENSE reconstruction methods. Reconstruction means that magnetic resonance data based on the data sets acquired with at least two acquisition coils are determined for a predetermined k-space point. For example, adjacent k-space points or k-space lines from the data sets are used for this. The reconstruction can ensue via a weighted combination of the MR data from the raw data sets under consideration of the respective coil sensitivities, for example. The reconstruction thus essentially corresponds to an estimation of the MR data for the k-space point that would be expected given an error-free sampling of the k-space point.

If MR data are likewise acquired for k-space points for which MR data can be reconstructed from the acquired raw data sets, redundant information for these k-space points exist. A check as to whether the acquired MR data are afflicted by errors ensues in the computer 18 for such points, and if this is established a replacement of the acquired MR data with the MR data reconstructed for the respective k-space point ensues.

The computer 18 can be configured to implement a GRAPPA, SMASH, SENSE or similar reconstruction method or a derivative of these methods. The computer 18 can implement the reconstruction both in k-space and in image space or in a hybrid space. The computer 18 is therefore likewise configured to reconstruct image data from acquired magnetic resonance data.

FIG. 1 illustrates only an exemplary configuration, and the computer 18, for example, can be divided into multiple components. The computer 18 can be a system computer with an image computer, a sequence controller and a terminal to which specification unit 19 and display 20 are connected.

FIG. 2 shows as an example the workflow of a method according to an embodiment of the present invention that, for example, can be implemented on computer 18. The acquisition of magnetic resonance data with at least two acquisition coils initially ensues in Step 201, wherein at least two raw MR data sets are generated. To acquire the raw data set, k-space is filled with MR data by switching frequency and phase coding gradients and respectively detecting MR signals. For example, one k-space line is acquired for each switched (activated) phase coding gradient. A complete raw data set can be acquired, or k-space lines can be omitted as in a PPA method. For predetermined k-space points, a check of the acquired MR data subsequently ensues in Step 202. These points can be the k-space points for which redundant information exists. In Step 202 the MR data for the respective k-space point can be compared with a threshold, for example, wherein exceeding the threshold indicates incorrect MR data. If an interference occurs in the detection of the MR signals, the corresponding data point in k-space can exhibit interference spikes or "spike noise". Since the raw data sets are acquired in parallel with the acquisition coils, such an interference event results in incorrect MR data in all raw data sets at the corresponding k-space points. Such errors can, for example, occur for one or more points in the frequency coding direction for a specific phase coding gradient.

Such incorrect MR data can be distinguished by particularly high amplitudes that can be discovered with the threshold cited in the preceding. In a mapping of k-space these are thus the points that appear particularly bright. The check in Step 202 can ensue not only by a simple threshold comparison but also (as described in the following with regard to FIG. 3) by a comparison with a value reconstructed for the k-space point, in particular under consideration of the signal/noise ratio.

If it is established in Step 203 that the MR data acquired for the k-space point are incorrect, in Step 204 a replacement of the incorrect MR data with reconstructed MR data ensues. The MR data are reconstructed only if the acquired MR data should be replaced, but in other embodiments a reconstruction can already ensue before the checking in Step 202. The incorrect data point is essentially treated like an unsampled k-space point and the missing MR data are reconstructed based on the acquired raw data sets. As mentioned in the preceding, reconstruction methods that are in particular used in PPA imaging are thereby applied, such as SMASH, SENSE, GRAPPA or modifications of these methods.

An exemplary reconstruction method is described in the following with reference to FIG. 4. FIG. 4 shows two complete raw data sets 410 and 411 that, for example, were acquired with acquisition coils 21 and 22. The raw data sets are frequency-coded in the x-direction and phase-coded in the y-direction and contain k-space lines 412. With a PPA reconstruction method it is now enabled to determine multiple other lines shifted in k-space from one phase coding line. Due to the acquisition of the MR data with spatially independent coils, the raw data sets carry additional spatial information which are used in order to determine the missing information.

Due to the spatial sensitivities of the coils, spatial information can thus be obtained in order to replace specific phase codings. The spatial coil sensitivity thus represents an additional spatial coding.

The determination of the coil sensitivities can, for example, ensue via measurement of calibration scans before the beginning of the acquisition of the raw data sets, or by means of k-space lines (in particular from the middle region of k-space) acquired during the acquisition of the MR data. To reconstruct MR data of a data set, MR data from the acquired data sets 410 and 411 are combined by weighting with a weighting factor. For example, the weighting coefficients are chosen so that the combination of the MR data acquired by the coils simulates the effect of a phase coding gradient under consideration of the respective coil position. The coefficients to combine the MR data can thereby also be based on the aforementioned additional k-space lines in the middle k-space region, which corresponds to a self-calibration. For example, such a procedure occurs in the AutoSMASH, VD AutoSMASH or GRAPPA methods.

A GRAPPA reconstruction can ensue in k-space or in image space. The weighting coefficients can thereby be derived from the calibration data (for example from the middle k-space region) (autocalibration). The weighting coefficients can then be applied to the k-space data by means of an aliasing method or be applied directly to the "aliased" image data via multiplication in image space. The coefficients for an image space reconstruction can thereby be determined from the k-space coefficients through an inverse Fourier transformation. In GRAPPA, a complete raw data set/image data set can thereby be obtained for each component coil, wherein the sets for the different coils can be merged via summation or the like.

Details regarding the GRAPPA reconstruction can be learned from the printed document "A general formulation for quantitative g-factor calculation in GRAPPA reconstructions" by F. A. Breuer, M. Blaimer, N. Seiberlich, P. M. Jakob and M. A. Griswold, Proc. Intl. Soc. Mag. Reson. Med. 16 (2008).

As is roughly illustrated schematically in FIG. 4, a reconstruction of the k-space line 415 ensues on the basis of the k-space lines 413 and 414 from the raw data sets 410 or, respectively, 411. Since MR data have also been acquired for k-space line 415, a comparison of the acquired MR data and the reconstructed MR data can thus ensue, as well as possibly a replacement of the acquired data with the reconstructed data. Naturally, more than two data sets can be used to reconstruct the MR data. For example, a parallel acquisition with more than 100 coils can ensue, and data sets of a set of predetermined coils can be used for reconstruction.

FIG. 4 furthermore shows the partial or reduced data sets 420 and 421, wherein no MR data were acquired for the phase coding lines 416 (dashed lines). The incomplete data sets 420 and 421 can be completed via reconstruction as described in the preceding. However, here redundant information also exists for a middle region of k-space, such that a check and replacement of the acquired magnetic resonance data can ensue for these k-space points. For example, k-space line 424 can be reconstructed based on k-space lines 422 and 423, and error-plagued acquire data points of the k-space line 424 can be replaced with the reconstructed MR data.

Although here a reconstruction in k-space is illustrated as an example, the reconstruction can naturally also ensue in image space or in a hybrid pace. Such reconstruction methods are known to the man skilled in the art and should not be described in detail here. Additional information regarding reconstruction, for example with the GRAPPA method, can be learned from DE 101 26 078 B4 and DE 103 53 342 B4.

Referring again to FIG. 2, the replacement of the incorrect MR data with the MR data reconstructed in such a manner ensues in Step 204. If additional k-space points are to be checked in Step 205, the checking is continued in Step 202. After checking the last predetermined k-space point, the method is terminated.

In the reconstruction with GRAPPA, for example, k-space lines are used that are adjacent to the line to be reconstructed. In GRAPPA complete raw data sets are reconstructed for a number of N coils of a coil set N. By comparison, only one complete data set is reconstructed in other reconstruction methods that can also be used here. A back-calculation to individual coil data sets is possible if necessary. In SENSE the reconstruction ensues by unrolling in image space, for example. Such methods have the advantage that the spatial coil sensitivities are compact in image space. For example, in SENSE a corresponding image data set that exhibits corresponding aliasing effects is reconstructed for each incomplete data set. An image of the entire field of view is create from this set of intermediate images. In the reconstruction the contributions to each pixel of the intermediate image is taken into account by the back-aliasing effect. The resulting complete image corresponds to a complete raw data set; missing k-space lines can be determined from this. In the present method, incorrect MR data in k-space can be set to a value of zero or to a value that corresponds to the average of the surrounding k-space points, for example for initialization of a reconstruction in image space. The reconstruction then delivers an improved estimation of the corresponding data point.

FIG. 3 shows a flow diagram of an additional embodiment of the method according to the invention. The method is a modification of the method shown in FIG. 2, and the statements above with reference to FIGS. 2 and 4 can also be applied to the method of FIG. 3. The method can likewise be implemented by the computer 18 of the magnetic resonance system according to the invention. An acquisition of a raw data set for each acquisition coil of a set of acquisition coils ensues in Step 301. The coil set can include predetermined coils from a larger number of component coils. In Step 302 k-space points to be checked are determined. A check of the MR data acquired for the specific k-space points, and possibly a replacement of these, ensues in the subsequent Steps. For this a reconstruction of MR data for a k-space point to be checked ensues initially in Step 303 based on the acquired raw data sets. The reconstruction can ensue as described with regard to FIG. 4. in particular, a PPA reconstruction method can be used for the reconstruction. In a next Step 304 the reconstructed MR data are compared with the MR data that were acquired for the same k-space point. The comparison can take into account a signal noise to be expected or a specific signal noise in the acquired MR data. A reliable comparison is thus enabled. The comparison variable here is thus not a simple threshold but rather the reconstructed MR data. In Step 305 it is checked whether the deviation between the acquired MR data and the reconstructed MR data is above a predetermined value. If this is the case, the acquired MR data are replaced with the reconstructed MR data in Step 306. Otherwise the acquired MR data are retained. In Step 307 it is established whether additional k-space points are to be checked. If necessary the workflow branches back to Step 303. If no additional k-space points are to be checked, the method is terminated.

The magnetic resonance system according to the invention and the method according to the invention thus enable an efficient checking and replacement of incorrect MR data. In particular, a significantly higher image quality can therefore be achieved than in conventional error correction methods in which incorrect data points are simply set to a value of zero or are interpolated from adjacent data points. In particular, this is enabled via the parallel acquisition of magnetic resonance data with at least two acquisition coils, wherein redundant information is obtained. This redundancy and the use of PPA reconstruction methods enable the replacement with estimated MR data that correspond very well to the MR data that are actually expected for the k-space point.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to detect incorrect magnetic resonance (MR) data in k-space, comprising the steps of:
   positioning at least two acquisition coils at respective different positions with respect to an examination subject, and detecting MR signals from the examination subject using said at least two acquisition coils;
   entering MR data, representing the acquired MR signals, into a memory as a plurality of k-space points in k-space in said memory, to form a plurality of raw data sets comprising at least one raw data set for each of said at least two acquisition coils; and
   accessing said memory from a computer and, in said computer, automatically electronically checking, for at least one of said k-space points, whether the MR data entered at said at least one k-space point should be replaced and, when said checking indicates said MR data entered at said at least one k-space point should be replaced, replacing said MR data entered at said at least one k-space point with reconstructed MR data based on at least two of said raw data sets and spatial information indicating said different positions of the respective at least two acquisition coils.

2. A method as claimed in claim 1 comprising checking whether the MR data entered at said at least one of said k-space points should be replaced, by comparing the MR data entered at said at least one of said k-space points with a threshold.

3. A method as claimed in claim 1 comprising checking whether the MR data entered at said at least one of said k-space points should be replaced, by comparing the MR data entered at said at least one of said k-space points with a comparison value that represents a noise value, selected from the group consisting of determined signal noise and estimated signal noise, in said MR data.

4. A method as claimed in claim 1 comprising checking whether the MR data entered at said at least one of said k-space points should be replaced, by comparing said MR data entered at said at least one of said k-space points with a comparison value that is determined based on the reconstructed MR data.

5. A method as claimed in claim 1 comprising generating said reconstructed MR data with a partially parallel acquisition reconstruction technique.

6. A method as claimed in claim 1 comprising reconstructing said magnetic resonance data in a domain selected from the group consisting of k-space, image space, and a hybrid space.

7. A method as claimed in claim 1 comprising reconstructing said MR data using a combination of the MR data respectively in said plurality of raw data sets in k-space respectively from the at least two acquisition coils.

8. A method as claimed in claim 1 comprising reconstructing said MR data using a reconstruction technique selected from the group consisting of a GRAPPA reconstruction technique and a SMASH reconstruction technique.

9. A method as claimed in claim 1 comprising reconstructing said MR data using an image space-based reconstruction technique.

10. A method as claimed in claim 1 comprising acquiring at least one complete raw data set with each of said at least two acquisition coils.

11. A method as claimed in claim 1 comprising acquiring said raw data sets with said at least two acquisition coils using a partially parallel acquisition technique by acquiring at least one reduced raw data set with each acquisition coil, thereby producing a plurality of reduced raw data sets in k-space, in combination, forming a complete raw data set for reconstruction at a complete image.

12. A method as claimed in claim 1 comprising replacing said MR data at said at least one of said k-space points only for k-space points at which the respective raw data sets acquired with said at least two acquisition coils contain redundant data.

13. A magnetic resonance system comprising:
    a magnetic resonance data acquisition unit configured to receive an examination subject therein;
    at least two acquisition coils in said magnetic resonance data acquisition unit, said at least two acquisition coils being located at respective, different positions relative to an examination subject in said magnetic resonance data acquisition unit;
    a control unit configured to operate the data acquisition to detect magnetic resonance signals, using said at least two acquisition coils, from the examination subject;
    said control unit being configured to enter MR data, representing the acquired MR signals, into a plurality of k-space points in k-space in said k-space memory, to form a plurality of raw data sets comprising at least one raw data set for each of said at least two acquisition coils;
    a processor configured to automatically check, for at least one of said k-space points, whether the MR data entered at said at least one k-space point should be replaced and, when said checking indicates said MR data entered at said at least one k-space point should be replaced, and to automatically replace said MR data entered at said at least one k-space point with reconstructed MR data based on at least two of said raw data sets and spatial information indicating said different positions of the respective at least two acquisition coils.

14. A non-transitory computer-readable storage medium encoded with programming instructions, said storage medium being loaded into a computer and processing system of a magnetic resonance apparatus, comprising a data acquisition unit comprising at least two acquisition coils located at respective, different positions with respect to an examination subject, and wherein said computerized control and processing system comprises a k-space memory, said programming instructions causing said computerized control and processing system to:
    operate said data acquisition unit to detect magnetic resonance signals, using said at least two acquisition coils, from an examination subject;
    enter MR data, representing the acquired MR signals, into a plurality of k-space points in k-space in a k-space memory, to form a plurality of raw data sets comprising at least one raw data set for each of said at least two acquisition coils;
    check, for at least one of said k-space points, whether the MR data entered at said at least one k-space point should be replaced and, when said check indicates said MR data entered at said at least one k-space point should be replaced, replace said MR data entered at said at least one k-space point with reconstructed MR data based on at least two of said raw data sets and spatial information indicating said different positions of the respective at least two acquisition coils.

* * * * *